United States Patent
Ramamurthi et al.

[19]

[11] Patent Number: 6,071,315
[45] Date of Patent: Jun. 6, 2000

[54] TWO-DIMENSIONAL TO THREE-DIMENSIONAL VLSI DESIGN

[75] Inventors: Ram Ramamurthi, Allen, Tex.; Nobou Takeda, Sendai, Japan

[73] Assignee: Ball Semiconductor, Inc., Allen, Tex.

[21] Appl. No.: 09/113,731

[22] Filed: Jul. 10, 1998

[51] Int. Cl.[7] .................................................. G06F 17/50
[52] U.S. Cl. ............................... 716/19; 716/3; 257/618
[58] Field of Search ........................ 395/500.04, 500.2, 395/500.21, 500.22; 364/468.04, 468.25, 468.28; 430/311, 322, 296; 257/618

[56] References Cited

U.S. PATENT DOCUMENTS 5,472,828 12/1995 Akins et al. .

Primary Examiner—Paul R. Lintz
Assistant Examiner—Leigh Marie Garbowski
Attorney, Agent, or Firm—Haynes & Boone, L.L.P.

[57] ABSTRACT

An apparatus and a method for producing a mask, which was derived using two-dimensional design tools, for imparting circuit designs directly on a three-dimensional surface. The method for creating the mask includes the steps of creating a two dimensional design with at least one element, establishing a location coordinate for the element using a two-dimensional coordinate system, converting the location coordinate for the element into a spacial coordinate for the element using a three-dimensional spacial coordinate system, converting the spacial coordinate for the element into a positional coordinate, and generating the mask using the positional coordinate. The apparatus for implementing three-dimensional designs using a mask, which is generated from a two-dimensional design, includes a light source and an elliptical mirror. The elliptical mirror has two focal points so that the elliptical mirror can focus a beam of light onto the three-dimensional surface.

18 Claims, 4 Drawing Sheets

TWO-DIMENSIONAL TO THREE-DIMENSIONAL VLSI DESIGN

BACKGROUND OF THE INVENTION

This invention relates generally to fabrication of semiconductor devices, and more particularly, to an apparatus and a method for applying two dimensional very large scale integration (VLSI) circuit design techniques to a three-dimensional device.

Conventional integrated circuits, or "chips," are formed from two dimensional or flat surface semiconductor wafers. The semiconductor wafer is first manufactured in a semiconductor material manufacturing facility and it is then provided to a fabrication facility. At the latter facility, several layers are processed onto the semiconductor wafer surface using various design concepts, such as VLSI circuit design. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping, and polishing wafers from the crystal; and heat processing the semiconductor wafers. Moreover, the wafers produced by the above processes typically have many defects which are largely attributable to the difficulty in making a single, highly pure crystal due to the above cutting, grinding, and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the semiconductor wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round disks, and the completed chips are rectangular, the peripheral portion of each semiconductor wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding, cutting and forming the leads, positioning the assembled chip onto a printed circuit board, and mounting the assembled chip to the printed circuit board. The cutting and assembly steps introduce many errors and defects due to the precise requirements of such operations. In addition, the positioning and mounting steps are naturally two-dimensional in character, and therefore cannot be applied to circuit designs on curved or three-dimensional areas.

Specifically, circuits on flat chips are designed using two-dimensional computer aided circuit design tools. However, these conventional circuit design tools for VLSI circuitry design are not suitable for three-dimensional surfaces. Therefore, what is needed is an apparatus and a method for producing a mask for creating circuit designs on three-dimensional surfaces using two-dimensional circuit design tools.

SUMMARY OF THE INVENTION

The present invention, accordingly, provides an apparatus and a method for producing a mask for creating circuit designs on a three-dimensional surface using two-dimensional design tools. To this end, the apparatus for implementing three-dimensional designs using a mask, which is generated from a two-dimensional design, comprises a light source, a ling beam generator optically coupled to the light source, a ring beam transform optically coupled to the ring beam generator, and an elliptical mirror optically coupled to the ring beam transform for focusing a beam of light onto a three-dimensional semiconductor device, wherein the elliptical mirror has two focal points; one of the focal points corresponds to a location of the semiconductor device. The method for creating the mask, which imparts the design on the semiconductor device, comprises the steps of creating a two-dimensional design having at least one element, establishing a location coordinate for the element using a two-dimensional coordinate system, converting the location coordinate for the element into a spacial coordinate for the element using a three-dimensional mapping coordinate system, converting the spacial coordinate for the element into a positional coordinate, and generating the mask using the positional coordinate.

An advantage results from the foregoing because existing two dimensional circuit design tools can be utilized to create a mask that can be directly projected onto a three-dimensional surface.

DESCRIPTION OF THE EMBODIMENTS

Figure 1:
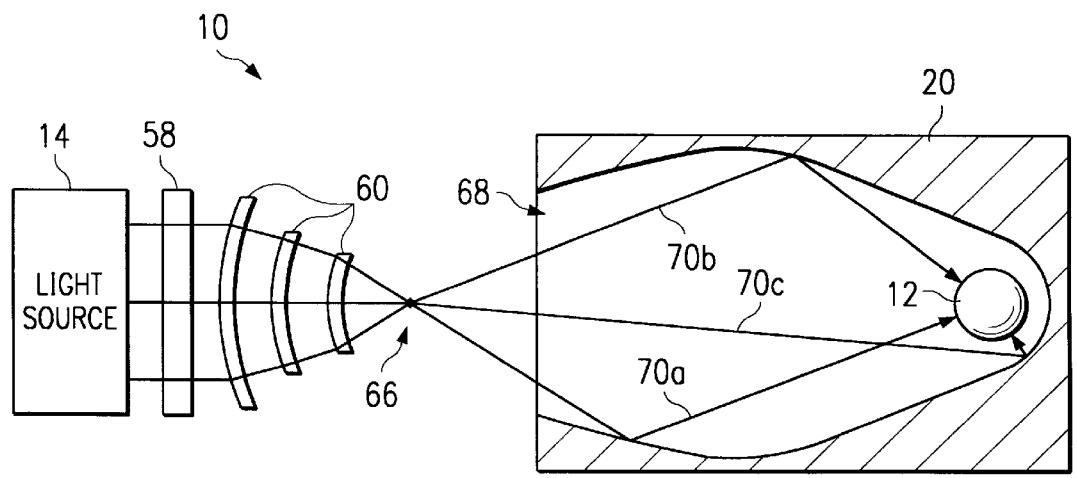
FIG. 1 illustrates a system for projecting a mask onto a sphere.

Referring to FIG. 1, the reference numeral 10 refers, in general, to one embodiment of a photo lithographic system for fabricating three-dimensional ("3D") VLSI circuit designs on a spherical shaped semiconductor substrate ("sphere") 12 having a predetermined radius using a mask 58. For the sake of example, in one embodiment, the predetermined radius is 0.5 millimeters ("mm"). The mask 58 is relatively flat, as compared with the shape of sphere 12.

The system 10 includes a light source 14 for generating a beam of light used to project a pattern onto the sphere 12. In a preferred embodiment, the light source 14 is a monochromatic light source. However, multi-wavelength light can be used instead of the monochromatic light. One example of the light source 14 is described, in detail, in Japanese Patent Serial No. 09/284,272.

The system 10 also includes the mask 58 and a plurality of convex prisms 60. Light from the light source 14 passes through the mask 58 and the convex prisms 60, reflects off the sides of elliptical mirror 20, and projects onto the sphere 12. Individual beams of the light pass through the mask 58 and are then offset by the prisms 60 and elliptical mirror 20 to project an image from the mask onto different "sides" of the sphere. The mask image is first focused at a focal point 66 by the prisms 60. The mask image is then focused onto a second focal point 68 by the elliptical mirror 20. The elliptical mirror 20 establishes the optical relation between the two focal points is so that light focused at one focal point will always be refocused at the other focal point. In order to project the mask 58 onto the sphere 12, the center of the sphere 12 is positioned at the focal point 68.

The mask image diverges and enters the elliptical mirror from the focal point 66. The mask image is refocused at the focal point 68 where the sphere 12 is positioned. In order to better understand the process, three exemplary beams, designated 70a, 70b, and 70c, are shown even though there are an infinite number of beams. Beams 70a and 70b are reflected from the wall of the elliptical mirror 20 and are focused on a "front" side of the sphere 12. The beam 70c is reflected from the wall of the elliptical mirror 20 and is focused on a "back" side of the sphere 12. The terms "front" and "back" are used only as relative references and are not to be interpreted as absolute references. The mask image carries the design of the mask 58 to the sphere 12. When the mask image is focused onto the sphere 12, a belt pattern is created onto the sphere 12.

Figure 2:
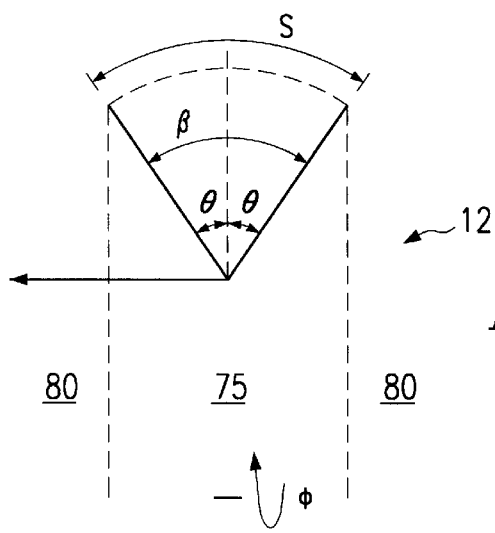
FIG. 2 illustrates the sphere of FIG. 1 prepared using a mask for implementing an embodiment of the present invention.
Figure 3:
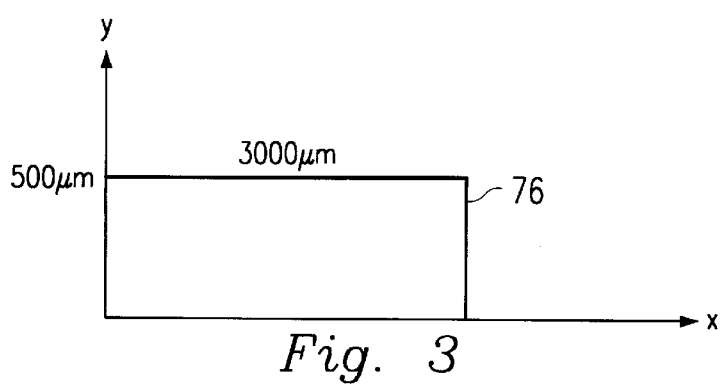
FIG. 3 illustrates a two-dimensional rectangle that is mapped to a mask and converted to a three-dimensional design, which is projected onto the sphere of FIG. 2.

Referring to FIGS. 2 and 3, the system 10 fabricates semiconductor device circuitry on at least one symmetrical belt 78 of the sphere 12. The remaining un-fabricated area of the sphere 12 is designated as unused portions 80. In a two dimensional representation, the belt 78 corresponds to a rectangle 76 as shown in FIG. 3. Accordingly, a two dimensional VLSI circuit design can be created using a rectangular coordinate system on an x-y plane within the dimensions of the rectangle 76 and then converted to the three-dimensional design for the sphere 12. The rectangle 76 is virtually wrapped around the sphere 12 to produce the belt 78.

FIG. 3 illustrates one example wherein the rectangle 76 has the dimensions 3,000 microns along the x-axis and 500 microns along the y-axis. Once the design is generated within the rectangle 76 a corresponding mask, such as mask 58 of FIG. 1, is generated and the mask 58 is projected or imaged onto the sphere 12 to produce a three-dimensional design. After the imaging of the mask onto the sphere, the belt 78 has the circuit design from the rectangle 76 projected thereon. The spacial relation between the belt 78 and the rectangle 76 is defined such that the x-axis of FIG. 3 is represented by the angle $\phi$ of FIG. 2, which is measured around the circumference of the belt 78 along a grid circle. The grid circle is the longest path along the surface of the sphere. The y-axis of FIG. 3 is mapped to and corresponds with an angular spread $\beta$ of FIG. 2. The angular spread is measured from edge-to-edge of the belt 78 and in a symmetrical belt design, the angular spread equals $2\theta$, wherein the angle $\theta$ is measured away from a plane containing the grid circle of the belt 78 from which the angle $\phi$ is measured. An arc length S represents the edge-to-edge distance along the sphere 12 and corresponds to the height of the rectangle 76 along the y-axis of FIG. 3. For example, when the angle $\theta$ is 30 degrees in a symmetrical belt, the arch S is approximately 500 microns long and the grid circle is about 3,000 microns long resulting in about 50% coverage of the surface of the sphere 12.

Figure 4:
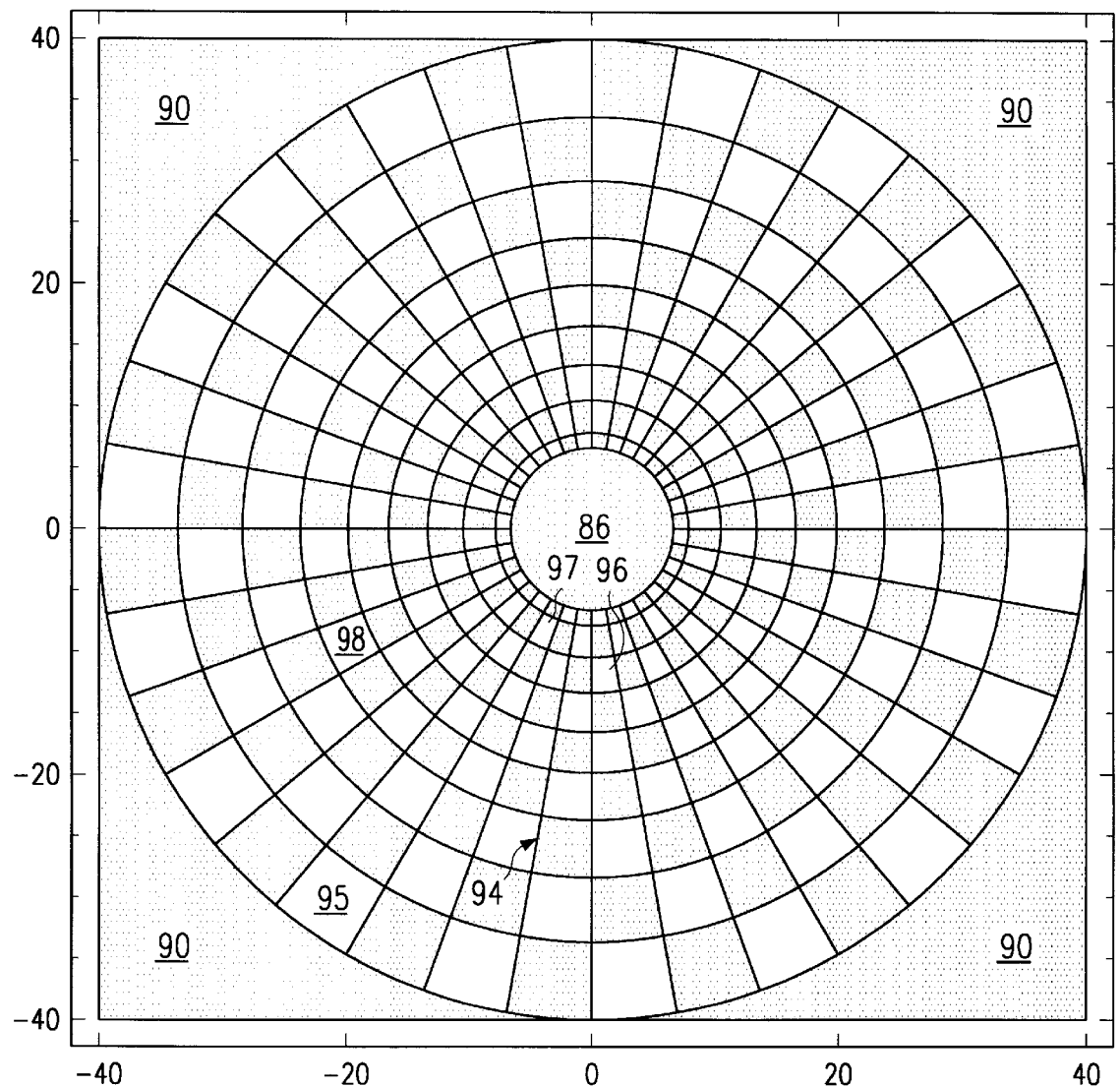
FIG. 4 illustrates a mask for the system of FIG. 1 having an angular spread of 85 degrees.
Figure 5:
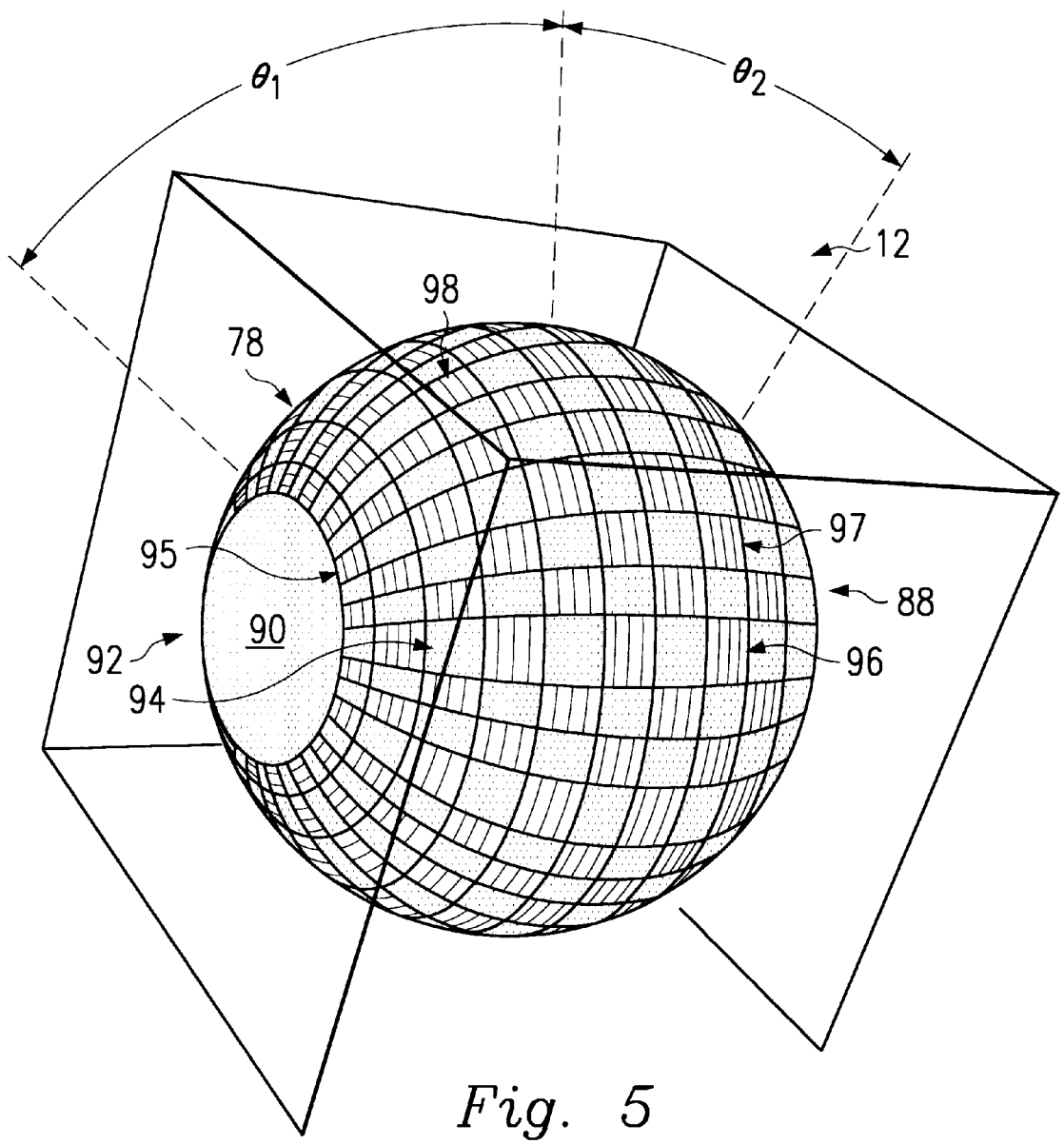
FIG. 5 illustrates a sphere prepared using the mask of FIG. 4.

Referring now to FIGS. 4 and 5, one exemplary embodiment of the mask 58 (and belt 78) is asymmetrical, with an angular spread $\beta$ of 85 degrees. In this embodiment, the angle $\theta_1$ measured away from the plane containing the grid circle toward one edge of the resulting belt 78 is not identical to the angle $\theta_2$ measured in the opposite direction toward an opposite edge of the resulting belt. Thus, the angular spread is the sum of $\theta_1$ and $\theta_2$, which equals 85 degrees. A dark region 86 in the center of the mask 58 in FIG. 4 corresponds to a back 88 of the sphere 12 in FIG. 5. A dark region 90 beyond the perimeter of the mask 58 in FIG. 4 corresponds to a front 92 of the sphere 12 in FIG. 5. For illustration purposes, portions 94, 95, 96, 97, and 98 are labeled to demonstrated the mapping from the mask 58 in FIG. 4 to the sphere 12 in FIG. 5.

Figure 6:
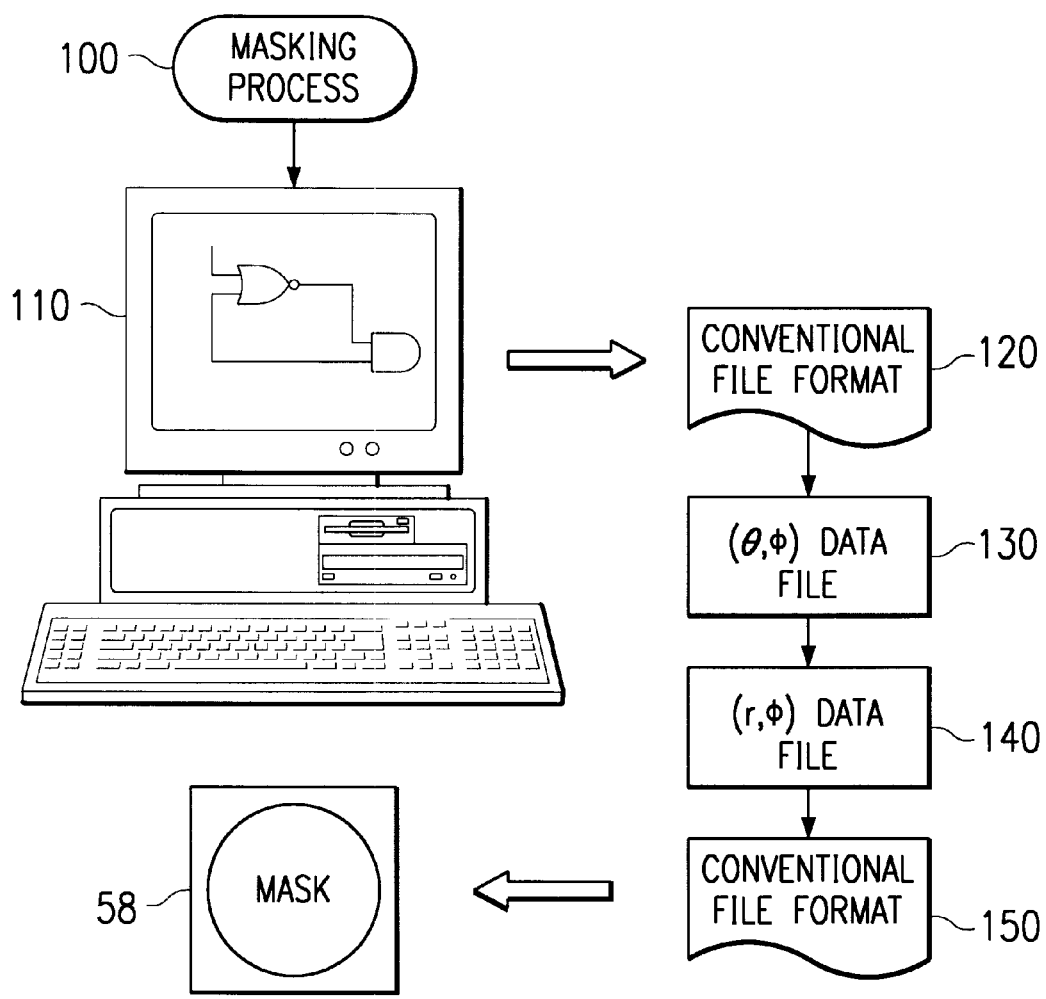
FIG. 6 shows a flowchart for preparing a mask for a three-dimensional circuit design.

FIG. 6 shows a flowchart for the process of generating the mask 58 beginning at step 100. At step 110, a two-dimensional circuit design is generated using any conventional computer aided circuit design tool. At step 120, a data file is created representing the two-dimensional design. The data file corresponds to a circuit design implemented inside the rectangle 76 of FIG. 3. The data file is generated with the location coordinates for each component or element of the circuit within the rectangle 76 using the conventional rectangular coordinate system represented by the pair (x,y). At step 130, the data file, which contains the location coordinates for the circuit components, is converted to three-dimensional spacial coordinates using coordinate pairing units ($\theta$, $\phi$) on a virtual sphere with dimensional identical to the sphere 12. The conversion from rectangular coordinates to spacial coordinates for the sphere is achieved using simple transformation techniques. The original 2D data file may account for any distortion that occurs during transformation.

At step 140, ray tracing techniques are utilized to map the spacial coordinates ($\theta$, $\phi$) on the virtual sphere to positional coordinates using polar coordinate pairing units (r, $\phi$) on a mask, such as the mask 58 of FIG. 1. The ray tracing techniques for mapping from spacial coordinates to positional coordinates is achieved by continuing the process illustrated above with reference to FIG. 1 and beams 70a, 70b, and 70c. In particular, a complete map from spacial to positional coordinates can be patterned, similar to the maps shown in FIGS. 4 and 5. At step 150, the polar coordinates are used to generate a mask, such as the mask 58, which is projected onto a three-dimensional object, such as the sphere 12 of FIG. 1.

It is understood that several modifications, changes and substitutions are intended in the foregoing disclosure and in some instances some features of the invention will be employed without a corresponding use of other features. For example, the mask 58 could be designed to only produce a portion of a belt. Also, the mask 58 could be designed to top produce a belt that wraps around the sphere 12 such that the unused portions are at the "top" and "bottom" rather than the "front" and the "back" of the sphere 12. Accordingly, it is appropriate that the appended claims be construed broadly and in a manner consistent with the scope of the invention.

What is claimed is:

1. A method of producing circuit designs on a relatively flat mask to accommodate a three-dimensional surface comprising the steps of:

producing a first set of circuit design components using two-dimensional circuit design tools;

transforming the first set of circuit components to be represented by a spacial coordinate system so that the first set of circuit components can fit on a virtual three-dimensional device; and producing a second set of circuit design components on the relatively flat mask by ray tracing the transformed first set of circuit components on the virtual three-dimensional device back to the relatively flat mask through a predetermined optical assembly.

2. The method of claim 1 wherein the step of producing a first set of circuit components includes establishing a location coordinate for each component of the first set using a two-dimensional coordinate system.

3. The method of claim 1 wherein the ray tracing converts each spacial coordinate into a positional coordinate for the corresponding component using an optical relationship defined by the position of the mask, the position of the virtual three-dimensional device, and the optical assembly.

4. A method of creating a mask for imparting a design on a three-dimensional spherical shaped device, the method comprising the steps of:

creating a two-dimensional design having at least one element;

establishing a location coordinate for the element using a two-dimensional coordinate system;

converting the location coordinate for the element into a spacial coordinate for the element using a three-dimensional spacial coordinate system;

converting the spacial coordinate for the element into a positional coordinate; and generating the mask using the positional coordinate.

5. The method of claim 4 wherein the step of converting the location coordinate comprises the steps of:

mapping the two-dimensional design onto a virtual device; and determining the spacial coordinates based upon a predetermined relationship between the location coordinates and the spacial coordinates.

6. The method of claim 5 wherein the virtual device is identical in shape to the device.

7. The method of claim 5 wherein the step of converting the spacial coordinate comprises the steps of:

optically tracing the spacial coordinates from the virtual device to the mask; and determining the positional coordinates based upon an optical relationship between the position of the mask and the position of the virtual device.

8. The method of claim 7 wherein the virtual device is identical in shape to the device.

9. A method for performing photolithography onto a spherical shaped semiconductor device comprising:

defining a belt portion on the sphere;

producing a two-dimensional circuit design;

converting the two-dimensional circuit design to a radially spaced circuit design;

generating a mask from the radially shaped circuit design;

positioning the semiconductor device at one of two focal points of an elliptical mirror;

projecting a light source through the mask; and focusing the light source at an opposite focal point of the elliptical mirror thereby causing the radially shaped circuit design to be refocused onto the device.

10. The method of claim 9 wherein the step of converting comprises the steps of:

transforming the location coordinate for each of a plurality of components in the circuit design into a spacial coordinate for that component by using a three-dimensional spacial coordinate system; and mapping the spacial coordinate for each of the components into a position coordinate.

11. The method of claim 10 wherein the step of mapping the spacial coordinate comprises the steps of:

projecting the transformed two-dimensional design onto a virtual device; and determining the position coordinate based upon a predetermined relationship.

12. The method of claim 11 wherein the virtual device is identical in shape to the semiconductor device.

13. The method of claim 12 wherein the semiconductor device is a sphere.

14. The method of claim 10 wherein the step of mapping the spacial coordinate comprises the steps of:

optically tracing the spacial coordinate from a virtual device to the mask; and determining the position coordinate based upon an optical relation between the position and orientation of the mask and the position and orientation of the semiconductor device.

15. The method of claim 14 wherein the virtual device is identical in shape to the semiconductor device.

16. A program product for producing circuit designs for a relatively flat mask to accommodate a non-flat substrate comprising:

a recordable medium;

instructions recorded on the recordable medium for producing a first set of circuit design components using two-dimensional circuit design tools;

instructions recorded on the recordable medium for transforming the first set of circuit components to be represented by a spacial coordinate system so that the first set of circuit components can fit on a virtual three-dimensional device; and instructions recorded on the recordable medium for producing a second set of circuit design components on the relatively flat mask by ray tracing the transformed first set of circuit components on the virtual three dimensional device back to the relatively flat mask through a predetermined optical assembly.

17. The programming product of claim 16 wherein the instruction for producing a first set of circuit components includes establishing a location coordinate for each component of the first set using a two-dimensional coordinate system.

18. The programming product of claim 16 wherein the ray tracing converts each spacial coordinate into a positional coordinate for the corresponding component using an optical relationship defined by the position of the mask, the position of the virtual three-dimensional device, and the optical assembly.

* * * * *

UNITED STATES PATENT AND TRADEMARK OFFICE
CERTIFICATE OF CORRECTION

PATENT NO. : 6,071,315
DATED : June 6, 2000
INVENTOR(s) : Ram Ramamurthi, Nobou Takeda It is certified that error appears in the above-identified patent and that said Letters Patent is hereby corrected as shown below:

On the title page: Item

[75] Inventors: "Ram Ramamurthi, Allen, Tex.; Nobou Takeda, Sendai, Japan" should read –Ram Ramamurthi, Allen, Tex.; Nobuo Takeda, Sendai, Japan--

Signed and Sealed this

Third Day of April, 2001

*Attest:*

NICHOLAS P. GODICI

*Attesting Officer*   *Acting Director of the United States Patent and Trademark Office*